(12) United States Patent
Trapp et al.

(10) Patent No.: US 7,291,895 B2
(45) Date of Patent: Nov. 6, 2007

(54) INTEGRATED CIRCUITRY

(75) Inventors: Shane J. Trapp, Boise, ID (US); Brian F. Lawlor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 10/391,952

(22) Filed: Mar. 18, 2003

(65) Prior Publication Data

US 2003/0203628 A1  Oct. 30, 2003

Related U.S. Application Data

(62) Division of application No. 09/924,816, filed on Aug. 7, 2001, now Pat. No. 6,806,197.

(51) Int. Cl.
*H01L 29/12* (2006.01)

(52) U.S. Cl. .................. 257/508; 257/E21.626; 257/E21.64; 257/900; 438/586

(58) Field of Classification Search .......... 257/314, 257/315, 316, 336, 344, 408, 900, 508
See application file for complete search history.

(56) References Cited

U.S. PATENT DOCUMENTS

| | | | |
|---|---|---|---|
| 4,514,251 A | 4/1985 | van Ommen et al. | |
| 4,780,426 A | 10/1988 | Koshino et al. | |
| 4,843,034 A | 6/1989 | Herndon et al. | |
| 5,087,589 A | 2/1992 | Chapman et al. | |
| 5,384,287 A * | 1/1995 | Fukase | 438/303 |
| 5,436,186 A | 7/1995 | Hsue et al. | |
| 5,780,338 A | 7/1998 | Jeng et al. | |
| 5,792,689 A | 8/1998 | Yang et al. | |
| 5,989,950 A * | 11/1999 | Wu | 438/228 |
| 6,063,548 A | 5/2000 | Chu et al. | |
| 6,066,550 A | 5/2000 | Wang | |
| 6,107,130 A * | 8/2000 | Fulford et al. | 438/231 |
| 6,117,719 A * | 9/2000 | Luning et al. | 438/230 |
| 6,162,688 A * | 12/2000 | Gardner et al. | 438/289 |
| 6,188,114 B1 * | 2/2001 | Gardner et al. | 257/408 |
| 6,194,265 B1 | 2/2001 | Chang et al. | |
| 6,281,064 B1 * | 8/2001 | Mandelman et al. | 438/233 |
| 6,806,197 B2 * | 10/2004 | Trapp et al. | 438/705 |
| 2001/0010373 A1 * | 8/2001 | Uchida | 257/94 |
| 2002/0001889 A1 * | 1/2002 | Kim et al. | 438/183 |
| 2002/0004248 A1 * | 1/2002 | Lee et al. | 438/3 |
| 2002/0125522 A1 * | 9/2002 | Chishiki | 257/306 |

* cited by examiner

*Primary Examiner*—Jerome Jackson
*Assistant Examiner*—Paul Budd
(74) *Attorney, Agent, or Firm*—Wells St. John P.S.

(57) ABSTRACT

A silicon nitride comprising layer formed over a semiconductor substrate includes Al, Ga or a mixture thereof. A silicon dioxide comprising layer is formed proximate thereto. The silicon dioxide comprising layer is removed substantially selectively relative to the silicon nitride comprising layer, with the Al, Ga or a mixture thereof enhancing selectivity to the silicon nitride comprising layer during the removal. A substantially undoped silicon dioxide comprising layer formed over a semiconductor substrate includes B, Al, Ga or mixtures thereof. A doped silicon dioxide comprising layer is formed proximate thereto. The doped silicon dioxide comprising layer is removed substantially selectively relative to the substantially undoped silicon dioxide comprising layer, with the B, Al, Ga or mixtures thereof enhancing selectivity to the substantially undoped silicon dioxide comprising layer during the removal. Integrated circuitry is also disclosed.

44 Claims, 5 Drawing Sheets

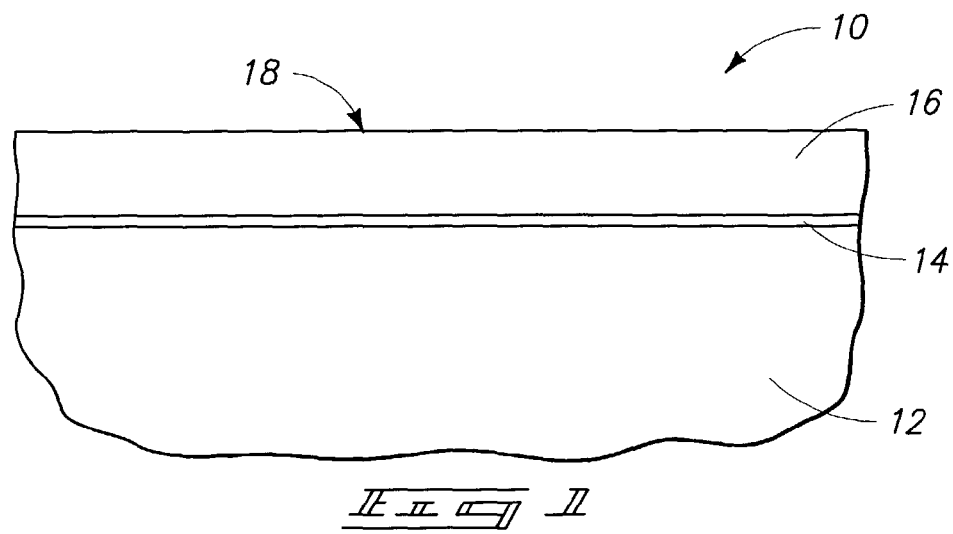
_Fig. 1_
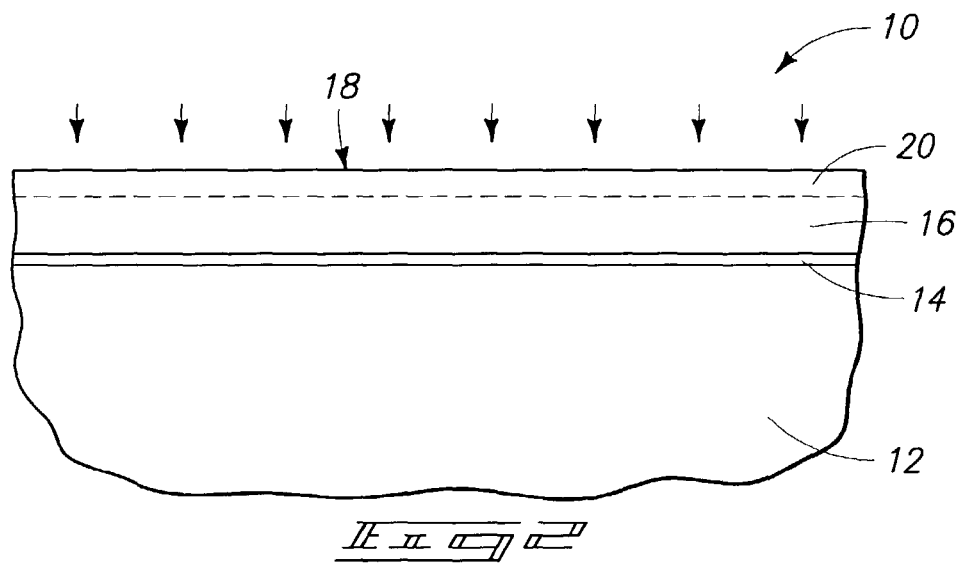
_Fig. 2_
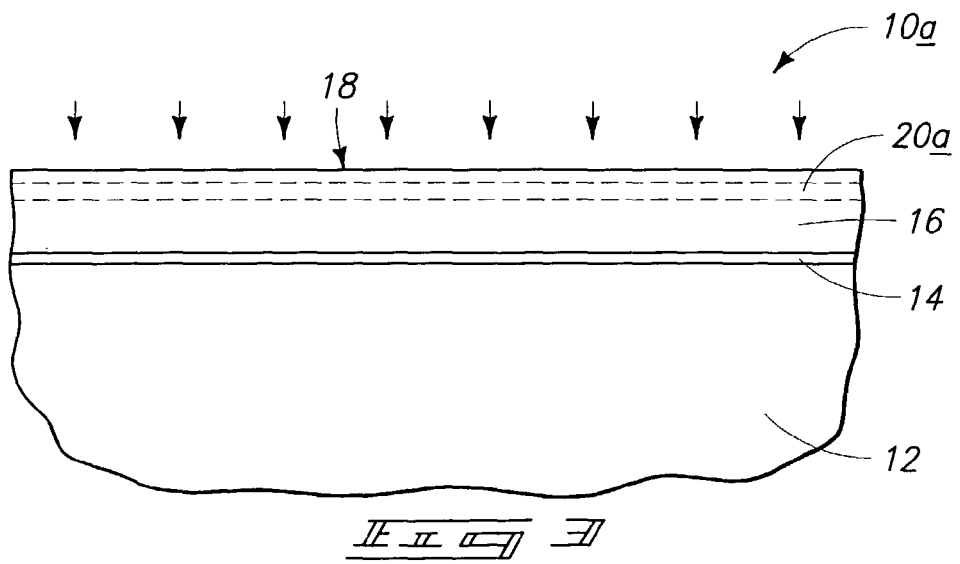
_Fig. 3_

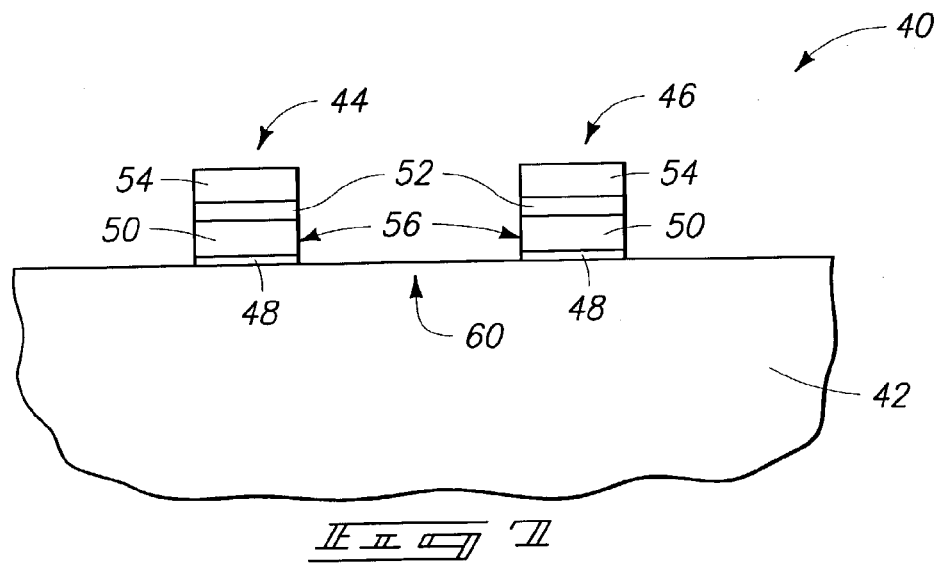
F I G 7
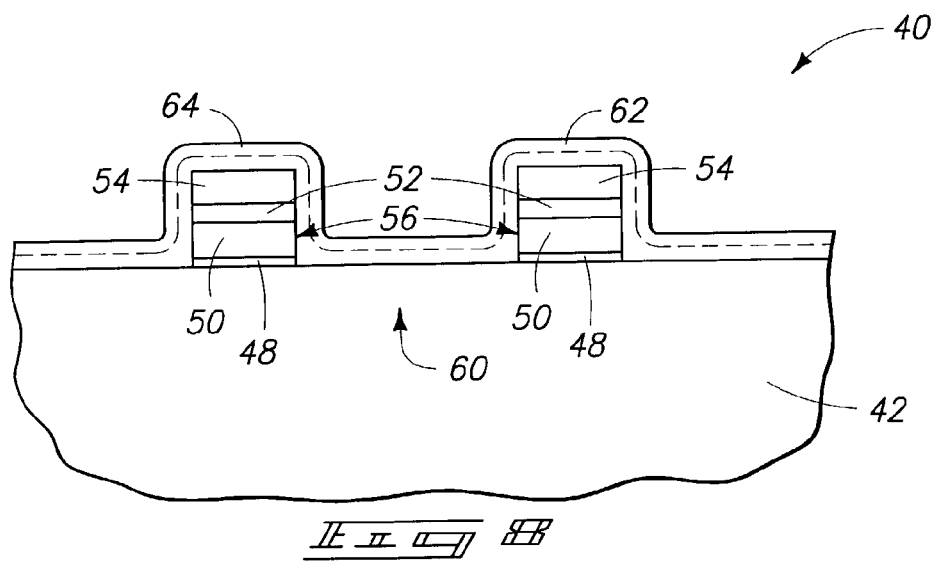
F I G 8
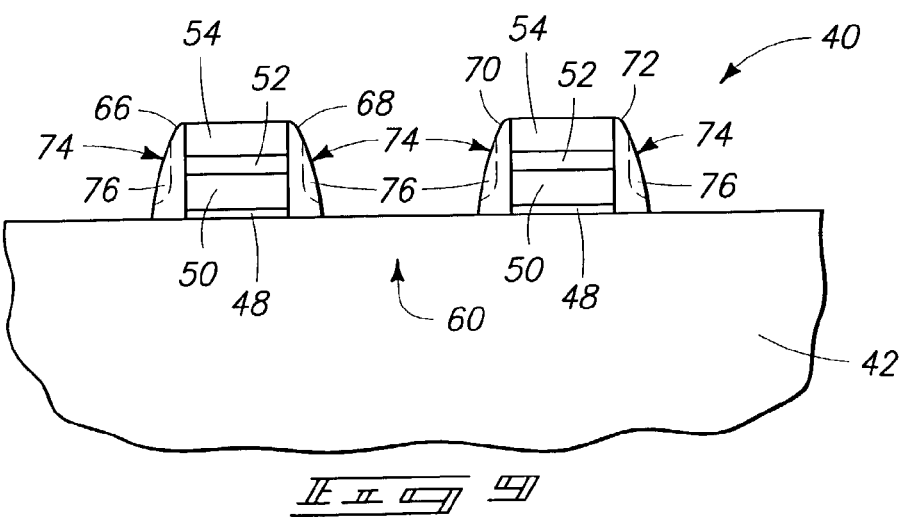
F I G 9

US 7,291,895 B2

INTEGRATED CIRCUITRY

This patent resulted from a divisional application of U.S. patent application Ser. No. 09/924,816, filed Aug. 7, 2001 now U.S. Pat. No. 6,806,197, entitled "Method of Forming Integrated Circuitry, and Method of Forming a Contact Opening", naming Shane J. Trapp and Brian F. Lawlor as inventors, the disclosure of which is incorporated by reference.

TECHNICAL FIELD

This invention relates to methods of forming integrated circuitry, to methods of forming contact openings, and to integrated circuitry.

BACKGROUND OF THE INVENTION

Semiconductor processing often involves the deposition of films or layers over or on a semiconductor substrate surface which may or may not have other layers already formed thereon. In typical circuitry fabrication, portions of an outer layer are masked, typically using photoresist, to provide a desired pattern over the outer layer. An underlying layer is then removed by chemical etching through the mask opening, with the mask covering and protecting other areas from the etching. Often it is desirable to etch an outer layer or layers selectively relative to an underlying layer. Accordingly, materials on the substrate, etch chemistry and conditions are continually being developed and improved to achieve a manner by which the desired layer(s) can be etched while stopping and substantially not etching an underlying layer.

Also, some layers are removed by mechanical polishing action or by chemical mechanical polishing action. In many such instances, it is also desirable to remove one or more layers while stopping on some immediately underlying layer.

SUMMARY

The invention includes methods of forming integrated circuitry, methods of forming contact openings, and integrated circuitry. In one implementation, a silicon nitride comprising layer is formed over a semiconductor substrate. The silicon nitride comprising layer includes Al, Ga or a mixture thereof. A silicon dioxide comprising layer is formed proximate the silicon nitride comprising layer. The silicon dioxide comprising layer is removed substantially selectively relative to the silicon nitride comprising layer, with the Al, Ga or a mixture thereof enhancing selectivity to the silicon nitride comprising layer during the removal.

In one implementation, a substantially undoped silicon dioxide comprising layer is formed over a semiconductor substrate. The substantially undoped silicon dioxide comprising layer includes B, Al, Ga or mixtures thereof. A doped silicon dioxide comprising layer is formed proximate the substantially undoped silicon dioxide comprising layer. The doped silicon dioxide comprising layer is removed substantially selectively relative to the substantially undoped silicon dioxide comprising layer, with the B, Al, Ga or mixtures thereof enhancing selectivity to the substantially undoped silicon dioxide comprising layer during the removal.

In one implementation, integrated circuitry includes a pair of spaced conductive device components received over a substrate, with such at least partially defining a node location there between. Each device component has at least one sidewall which faces the other device component of the pair. An insulative material mass is received over each of the sidewalls. The masses are laterally spaced from one another in a non-contacting relationship. The masses comprise a first insulative material comprising B, Al, Ga or mixtures thereof. A conductive contact is received between the insulative material masses in electrical connection with the node location.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that shown by FIG. 1.

FIG. 3 is a view of the FIG. 1 wafer fragment at an alternate processing step to that shown by FIG. 2.

FIG. 7 is a diagrammatic sectional view of an alternate embodiment semiconductor wafer fragment in process in accordance with an aspect of the invention.

FIG. 8 is a view of the FIG. 7 wafer fragment at a processing step subsequent to that shown by FIG. 7.

FIG. 9 is a view of the FIG. 7 wafer fragment at an alternate processing step to that shown by FIG. 8.

DETAILED DESCRIPTION OF THE PREFERRED EMBODIMENTS

Figure 4:
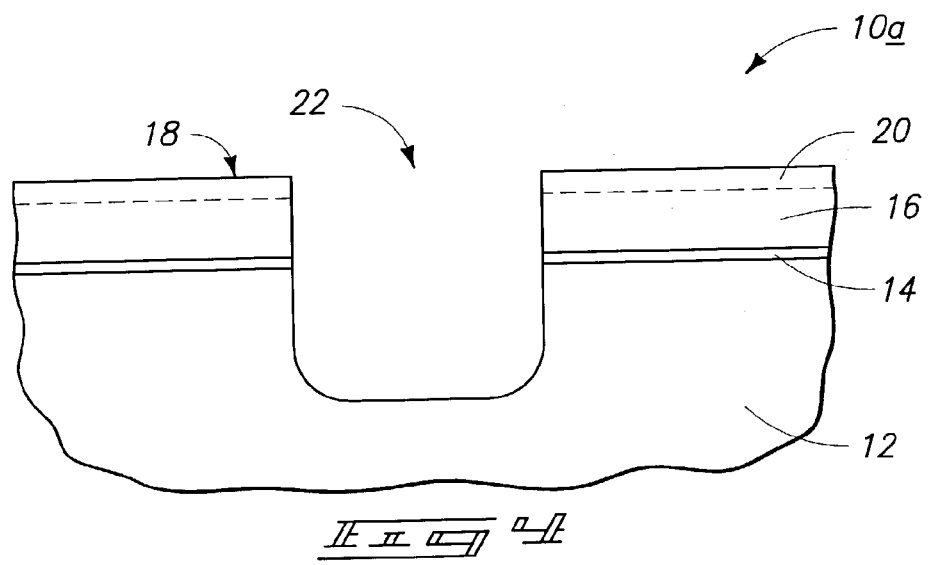
FIG. 4 is a view of the FIG. 2 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

Exemplary preferred embodiments of forming integrated circuitry are initially described with reference to FIGS. 1-6. FIG. 1 depicts a wafer fragment 10 comprising a bulk monocrystalline silicon substrate region 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

A pad oxide layer 14 is formed over semiconductor substrate 12. A silicon nitride comprising layer 16 is formed over pad oxide layer 14 and semiconductor substrate 12. An exemplary thickness range for layer 14 is from 50 Angstroms to 150 Angstroms, while an exemplary thickness range for layer 16 is from 400 Angstroms to 1200 Angstroms. Silicon nitride comprising layer 16 has an outer surface 18.

Referring to FIG. 2, at least one enriched region 20 is formed within silicon nitride comprising layer 16. Enriched region 20 is characterized at least by the presence of Al, Ga or mixture thereof. One preferred method of forming enriched region 20 is by ion implanting at least one of Al and Ga into silicon nitride comprising layer 16. Another preferred method is by plasma enhanced or gas phase thermal diffusion. An exemplary diffusion species for aluminum is trimethyl aluminum, while an exemplary diffusion species for gallium is trimethyl gallium. Preferably, enriched region 20 extends to at least a portion of outer surface 18, with FIG. 2 depicting region 20 extending to all of outer surface 20. An example preferred implant is to place a peak concentration depth from about 10 Angstroms to about 400 Angstroms beneath outer surface 18. Again, trimethyl aluminum and trimethyl gallium would be exemplary implant species. Exemplary doses are from $5 \times 10^{12}$ ions/cm$^2$ to $15 \times 10^{12}$ ions/cm$^2$, with a narrower preferred range being from $10 \times 10^{12}$ ions/cm2 to $12 \times 10^{12}$ ions/cm2. Exemplary implant energies are from 2 KeV to 25 KeV. FIG. 3 depicts an alternate preferred embodiment wafer fragment 10a whereby enriched region 20a is spaced from outer surface 18. Of course, regions 20 and 20a might also be formed by methods other than ion implanting or gas phase diffusion, for example and by way of example only such as during the deposition of layer 16 (i.e., during chemical vapor deposition) or by deposition of a separate layer thereover. For example, and by way of example only, the forming of said silicon nitride comprising layer might comprise chemical vapor deposition over a previously deposited layer consisting essentially of silicon nitride.

Referring to FIG. 4, layers 16 and 14 have been patterned to form an opening 22 therethrough and into semiconductor substrate 12.

Figure 5:
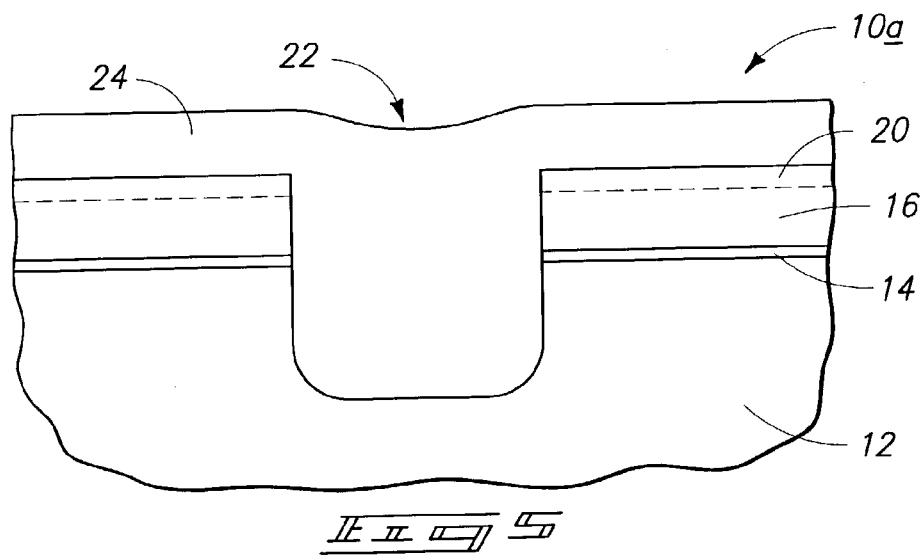
FIG. 5 is a view of the FIG. 2 wafer fragment at a processing step subsequent to that shown by FIG. 4.

Referring to FIG. 5, a silicon dioxide comprising layer 24 is formed proximate silicon nitride comprising layer 16 and, in the preferred embodiment as shown, is formed on (in contact with) silicon nitride comprising layer 16. Silicon dioxide comprising layer 24 might be doped or substantially undoped. In the context of this document, "doped" means doping with one or both of phosphorous and boron, and to a total dopant concentration of one or more of such materials to at least 1% by weight average. "Substantially undoped" means a total combined doping of boron and/or phosphorous, if any, at less than 1% by weight.

Figure 6:
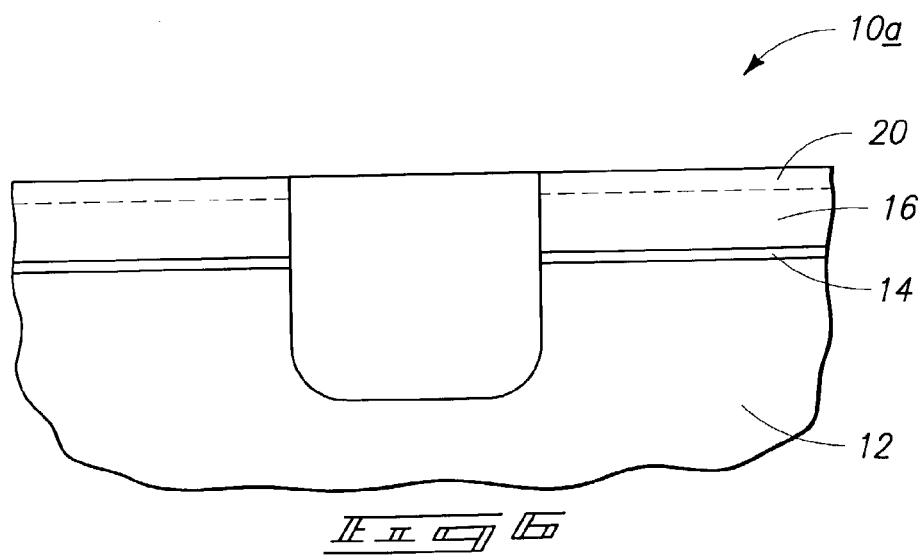
FIG. 6 is a view of the FIG. 2 wafer fragment at a processing step subsequent to that shown by FIG. 5.

Referring to FIG. 6, silicon dioxide comprising layer 24 is removed substantially selectively relative to silicon nitride comprising layer 16, with the at least one enriched region 20 preferably enhancing selectivity to silicon nitride comprising layer 16 during the removing. Such removing is preferably by chemical etching, or by other techniques for example by polishing. In the context of this document, "substantially selectively" means a removal rate of one material relative to another of at least 1.5:1. By way of example only, an exemplary process for etching silicon dioxide selectively relative to silicon nitride where region 20 facilitates selectivity in the etch includes a TEL DRM reactive ion etcher, operated at 1500W, 45 mTorr, Ar flow at 500 sccm, $C_4F_8$ flow at 12 sccm, and $CH_2F_2$ flow at 6 sccm.

Regions 20/20a might, of course, in the depicted first exemplary embodiment, be formed prior to or subsequent to fabrication of the exemplary opening 22. Further, in one preferred embodiment, silicon nitride comprising layer 16 with enriched region 20/20a can be annealed prior to the removing action. Such might be desirable to facilitate migration of the gallium or aluminum to bond sites within silicon nitride comprising layer 16. Any alternate or additional fabrication is also contemplated in the context of the accompanying claims.

In one implementation, the invention also contemplates forming integrated circuitry comprising forming a substantially undoped silicon dioxide comprising layer over a semiconductor substrate. At least one enriched region analogous to regions 20 and 20a in the above-described first preferred silicon nitride comprising layer embodiment is formed within the substantially undoped silicon dioxide comprising layer. The enriched region comprises B, Al, Ga or mixtures thereof. An exemplary diffusion species for Boron is diborane, while an exemplary implant species for boron is $B^{11}$. A doped silicon dioxide comprising layer is formed proximate, and more preferably on, the substantially undoped silicon dioxide comprising layer. The doped silicon dioxide comprising layer is removed substantially selectively relative to the substantially undoped silicon dioxide comprising layer. The at least one enriched region preferably enhances selectivity to the substantially undoped silicon dioxide comprising layer during the removing. Again, removing is preferably by chemical etching, with removal by polishing or other techniques also of course being contemplated. By way of example only, an exemplary process for etching doped silicon dioxide selectively relative to substantially undoped silicon dioxide where region 20 facilitates selectivity in the etch includes a 12 Liter Applied Materials 5000 Etch Chamber, operated at 1000W, 50 mtorr, Ar flow at 120 sccm, $CF_4$ flow at 30 sccm, $CHF_3$ flow at 50 sccm, and $CH_2F_2$ flow at 15 sccm.

The above-described preferred embodiments are associated with forming respective enriched regions within the subject layers. However, in one aspect, the invention also more generically contemplates forming a silicon nitride comprising layer also comprising Al, Ga or a mixture thereof. Such Al, Ga or a mixture thereof might be present in the silicon nitride comprising layer as an enriched region, as described in the above preferred embodiments, or such might be substantially homogeneously distributed within the silicon nitride comprising layer, with the Al, Ga or a mixture thereof enhancing selectivity to the silicon nitride comprising layer during the subject removing.

With respect to a substantially undoped silicon dioxide comprising layer, the invention also more generically contemplates B, Al, Ga or mixtures thereof being present within the substantially undoped silicon dioxide comprising layer, with such enhancing selectivity to the substantially undoped silicon dioxide comprising layer during the removing. Again by way of example only, the B, Al, Ga or mixtures thereof might be present as an enriched region or portion thereof, or might be substantially homogeneously distributed within the substantially undoped silicon dioxide comprising layer.

By way of example only, alternate preferred embodiments of the invention are described with reference to FIGS. 7-12. FIG. 7 depicts a semiconductor wafer fragment 40 comprising a bulk monocrystalline silicon substrate 42. A pair of field effect transistor gate stacks 44 and 46 are shown formed over substrate 42. Such respectively comprise a gate dielectric layer 48, a conductive polysilicon portion 50, an overlying higher conductive silicide layer 52, and an overlying insulative cap 54. Regions 50 and 52 constitute the conductive portion of stacks 44 and 46, and depict an exemplary pair of spaced conductive device components formed over semiconductor substrate 42. Of course, any alternate pair of spaced conductive device components are contemplated. For purposes of the continuing discussion, spaced conductive device components 50/52 have at least one sidewall 56 which faces the other device component of the pair. This particular preferred embodiment is described in conjunction with a method of forming a contact opening within insulative material to a node location, for example location 60, located between conductive device components 50/52 of each stack 44 and 46.

Referring to FIG. 8, an insulative layer 62 is formed over device components 50/52 and on substrate material 42 between the device components. In one preferred embodiment, layer 62 comprises silicon nitride. In another preferred exemplary embodiment, insulative layer 62 comprises substantially undoped silicon dioxide. In the depicted preferred embodiment, a continuous enriched outer region 64 comprising B, Al, Ga or mixtures thereof is formed. Exemplary techniques for forming the same include those as described above. Preferably as shown, outer region 64 is formed to be continuous, and also to extend to at least a portion of, and to the entirety of as shown, the outer surfaces of insulative layer 62.

Referring to FIG. 9, layer 62 has been anisotropically etched, preferably without any photomasking, effective to form insulative material masses 66, 68, 70 and 72 in the form of insulative spacers, with insulative masses 68 and 70 being formed over facing sidewalls 56 of conductive device components 50/52. Such insulative material masses have lateral outer surfaces 74 extending from bases thereof proximate substrate 42 to the tops of the illustrated constructions. Spacers 66, 68, 70 and 72 also comprise respective enriched lateral outer regions 76 comprising B, Al, Ga or mixtures thereof. Such provides but one example of forming insulative material masses over each of sidewalls 56, with the preferred masses being laterally spaced from one another in a non-contacting relationship. Any alternate existing or yet-to-be-developed method of forming insulative masses is also contemplated. In the depicted preferred embodiment, enriched lateral outer regions 76 extend to at least a portion of the respective outer lateral surfaces 74, and are elevationally spaced from substrate material 42 between the device components.

Figure 10:
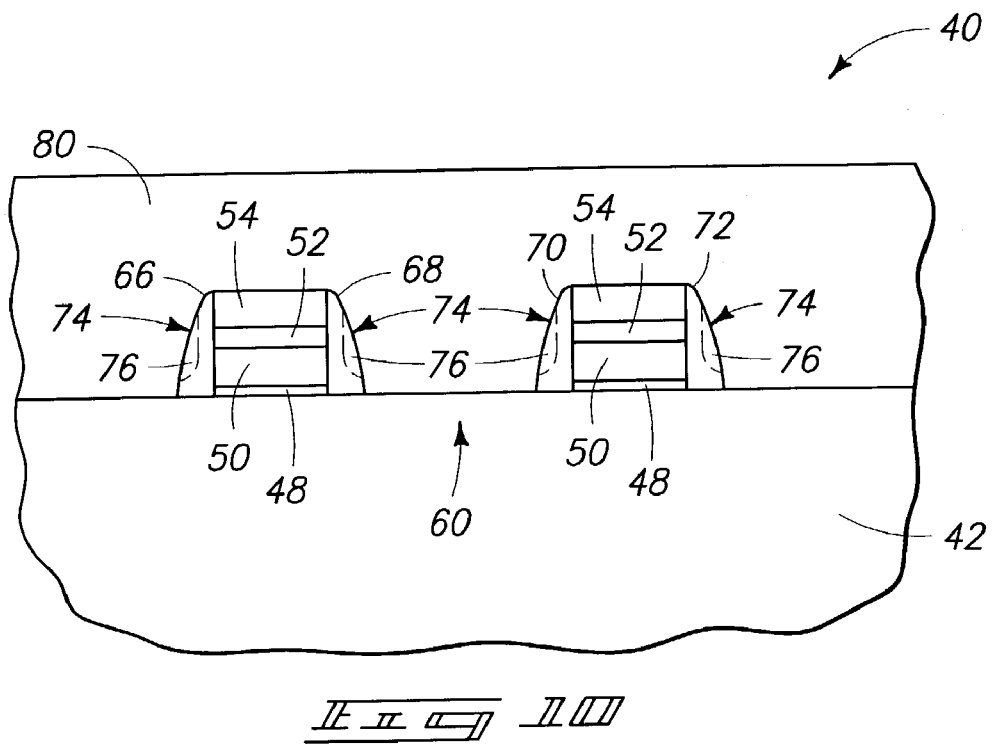
FIG. 10 is a view of the FIG. 7 wafer fragment at an alternate processing step to that shown by FIG. 9.

Referring to FIG. 10, a second insulative material 80, different from the first insulative material, is formed between insulative material masses 68 and 70, and otherwise preferably over the substrate as shown. Where insulative masses 68 and 70 comprise substantially undoped silicon dioxide, one preferred material for layer 80 is doped silicon dioxide. Where insulative masses 68 and 70 comprise silicon nitride, two exemplary materials for layer 80 include doped silicon dioxide and substantially undoped silicon dioxide.

Figure 11:
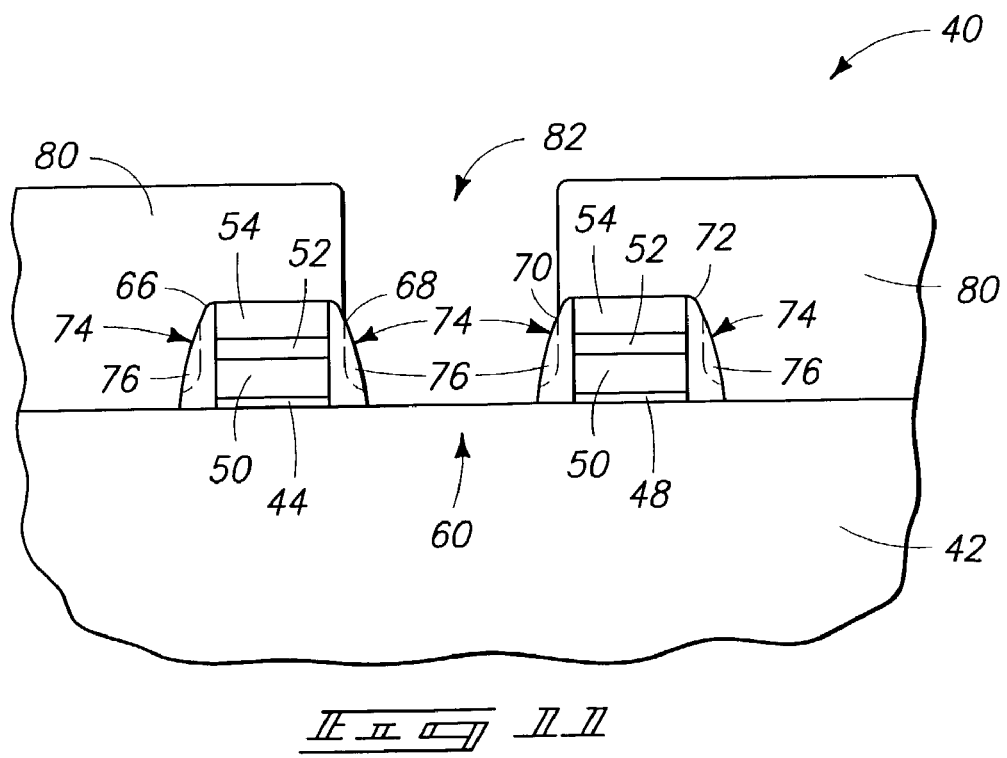
FIG. 11 is a view of the FIG. 7 wafer fragment at an alternate processing step to that shown by FIG. 10.

Referring to FIG. 11, a contact opening 82 is etched into insulative material 80 to node location 60 between insulative material masses 68, 70 substantially selectively relative thereto. Lateral outer enriched regions 76 preferably enhance selectivity to the insulative masses during such etching. In a more generic sense, the invention contemplates inclusion of B, Al, Ga or mixtures thereof within insulative material masses 68, 70 whether in enriched regions 76 as shown, substantially homogeneously distributed within the insulative material masses, or otherwise.

Figure 12:
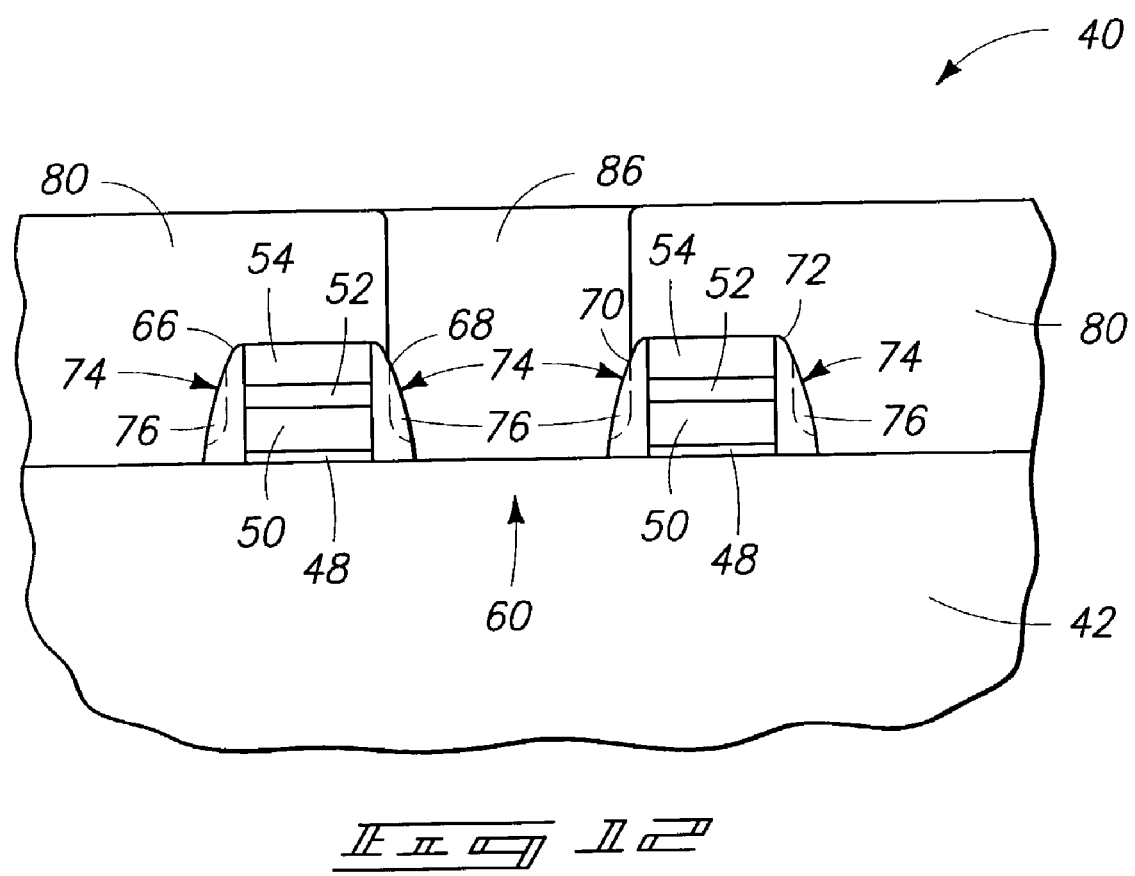
FIG. 12 is a view of the FIG. 7 wafer fragment at an alternate processing step to that shown by FIG. 11.

Referring to FIG. 12, conductive material 86 is shown having been formed within contact opening 82 between insulative material masses 68 and 70 in electrical connection with node location 60. Such might be provided by the provision of one or more conductive layers which, in the preferred embodiment, shows the formation of a conductive contact to a node location 60. Node location 60 might be a diffusion region, or any node location constituting a portion of integrated circuitry being formed.

The above-described preferred embodiments are only exemplary in connection with methodical aspects of the invention, which are only limited by the accompanying claims as literally worded and as interpreted in accordance with the doctrine of equivalents. The invention also contemplates integrated circuitry independent of the method of fabrication as literally claimed without limitation to the preferred depicted embodiments, and as interpreted in accordance with the doctrine of equivalents.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. Integrated circuitry comprising:
   a pair of spaced and adjacent conductive device components received over a substrate, and a node location therebetween, each device component having at least one sidewall which faces the other device component of the pair;
   an insulative mass received over each of said sidewalls, the masses being laterally spaced from one another in a non-contacting relationship, the masses comprising an insulative material comprising Ga and Al; and
   a conductive contact received between the insulative masses in electrical connection with the node location.

2. The integrated circuitry of claim 1 wherein the Ga and Al are substantially homogeneously distributed within the insulative masses.

3. The integrated circuitry of claim 1 wherein the insulative masses comprises B.

4. The integrated circuitry of claim 1 wherein the device components comprise field effect transistor gates.

5. Integrated circuitry comprising:
   a pair of spaced conductive device components received over a substrate, and a node location therebetween, each device component having at least one sidewall which faces the other device component of the pair;
   an insulative mass received over each of said sidewalls, the masses being laterally spaced from one another in a non-contacting relationship, the masses comprising an insulative material comprising Al, Ga or a mixture thereof, the insulative material further comprising B; and
   a conductive contact received between the insulative masses in electrical connection with the node location.

6. The integrated circuitry of claim 5 wherein the device components comprise field effect transistor gates.

7. Integrated circuitry comprising:
   a pair of spaced conductive device components received over a substrate, and a node location therebetween, each device component having at least one sidewall which faces the other device component of the pair;
   an insulative mass received over each of said sidewalls, the masses being laterally spaced from one another in a non-contacting relationship, the masses comprising an insulative material and having a respective lateral outer enriched insulative material region comprising Al, Ga or a mixture thereof which has greater quantity of said Al, Ga or mixture thereof as compared to another region of said insulative mass; and
   a conductive contact received between the insulative masses in electrical connection with the node location.

8. The integrated circuitry of claim 7 wherein the device components comprise field effect transistor gates.

9. The integrated circuitry of claim 7 wherein the insulative masses comprise anisotropically etched sidewall spacers.

10. The integrated circuitry of claim 7 wherein the insulative masses comprise bases and tops, the bases being wider than the tops.

11. The integrated circuitry of claim 7 wherein the insulative masses have lateral outer surfaces, the outer enriched regions extending to at least a portion of the lateral outer surfaces.

12. The integrated circuitry of claim 7 wherein the insulative material comprises substantially undoped silicon dioxide.

13. The integrated circuitry of claim 7 wherein the insulative material comprises silicon nitride.

14. The integrated circuitry of claim 7 wherein the conductive contact is received on the insulative masses.

15. The integrated circuitry of claim 7 wherein the enriched region comprises Al.

16. The integrated circuitry of claim 7 wherein the device components comprise field effect transistor gates.

17. The integrated circuitry of claim 7 wherein the another region is received immediately laterally inward of the lateral outer enriched region.

18. Integrated circuitry comprising:
a pair of spaced conductive device components received over a substrate, and a node location therebetween, each device component having at least one sidewall which faces the other device component of the pair;
an insulative mass received over each of said sidewalls, the masses being laterally spaced from one another in a non-contacting relationship, the masses comprising an insulative material and having a respective lateral outer enriched region comprising Al, Ga or a mixture thereof, the insulative material further comprising B; and
a conductive contact received between the insulative masses in electrical connection with the node location.

19. The integrated circuitry of claim 18 wherein the enriched region is electrically insulative.

20. The integrated circuitry of claim 18 wherein the device components comprise field effect transistor gates.

21. The integrated circuitry of claim 18 wherein the enriched region comprises Al.

22. The integrated circuitry of claim 18 wherein the enriched region comprises Ga.

23. The integrated circuitry of claim 18 wherein the enriched region comprises Al and Ga.

24. Integrated circuitry comprising:
a pair of spaced conductive device components received over a substrate, and a node location therebetween, each device component having at least one sidewall which faces the other device component of the pair;
an insulative mass received over each of said sidewalls, the masses being laterally spaced from one another in a non-contacting relationship, the masses comprising an insulative material and having a respective lateral outer enriched region comprising Ga which has greater quantity of Ga as compared to another region of said insulative mass that is received immediately laterally inward thereof; and
a conductive contact received between the insulative masses in electrical connection with the node location.

25. The integrated circuitry of claim 24 wherein the enriched region is electrically insulative.

26. The integrated circuitry of claim 24 wherein the device components comprise field effect transistor gates.

27. Integrated circuitry comprising:
a pair of spaced conductive device components received over a substrate, and a node location therebetween, each device component having at least one sidewall which faces the other device component of the pair;
an insulative mass received over each of said sidewalls, the masses being laterally spaced from one another in a non-contacting relationship, the masses comprising an insulative material and having a respective lateral outer enriched region comprising at least two of B, Al, and Ga; and
a conductive contact received between the insulative masses in electrical connection with the node location.

28. The integrated circuitry of claim 27 wherein the enriched region comprises B, Al, and Ga.

29. The integrated circuitry of claim 28 wherein the enriched region is electrically insulative.

30. The integrated circuitry of claim 27 wherein the enriched region is electrically insulative.

31. The integrated circuitry of claim 27 wherein the device components comprise field effect transistor gates.

32. Integrated circuitry comprising:
a pair of spaced conductive device components received over a substrate, and a node location therebetween, each device component having at least one sidewall which faces the other device component of the pair;
an insulative mass received over each of said sidewalls, the masses being laterally spaced from one another in a non-contacting relationship. the masses comprising an insulative material and having a respective lateral outer enriched region comprising Ga and Al which has greater guantity of Ga as compared to another region of said insulative mass; and
a conductive contact received between the insulative masses in electrical connection with the node location.

33. The integrated circuitry of claim 32 wherein the enriched region is electrically insulative.

34. The integrated circuitry of claim 32 wherein the another region is received immediately laterally inward of the lateral outer enriched region.

35. Integrated circuitry comprising:
a pair of spaced conductive device components comprising field effect transistor gates received over a substrate, and a node location therebetween, each field effect transistor gate having at least one sidewall which faces the other field effect transistor gate of the pair;
an insulative mass received over each of said sidewalls, the masses being laterally spaced from one another in a non-contacting relationship, the masses comprising an insulative material comprising Ga and Al; and
a conductive contact received between the insulative masses in electrical connection with the node location.

36. The integrated circuitry of claim 35 the Ga and Al are substantially homogeneously distributed within the insulative masses.

37. The integrated circuitry of claim 35 wherein the insulative masses comprises B.

38. Integrated circuitry comprising:
a pair of spaced conductive device components received over a substrate, and a node location therebetween, each device component having at least one sidewall which faces the other device component of the pair;
an insulative mass received over each of said sidewalls, the masses being laterally spaced from one another in a non-contacting relationship, the masses comprising an insulative material and having a respective lateral outer enriched insulative material region comprising Al, Ga or a mixture thereof, the insulative masses having lateral outer surfaces, the outer enriched regions extending to only a portion of the lateral outer surfaces; and a conductive contact received between the insulative masses in electrical connection with the node location.

39. The integrated circuitry of claim 38 wherein the device components comprise field effect transistor gates.

40. The integrated circuitry of claim 38 wherein the enriched region comprises Al.

41. The integrated circuitry of claim 38 wherein the enriched region comprises Ga.

42. The integrated circuitry of claim 38 wherein the enriched region comprises Al and Ga.

43. Integrated circuitry comprising:

a pair of spaced conductive device components received over a substrate, and a node location therebetween, each device component having at least one sidewall which faces the other device component of the pair;

an insulative mass received over each of said sidewalls, the masses being laterally spaced from one another in a non-contacting relationship, the masses comprising an insulative material comprising Ga and B; and a conductive contact received between the insulative masses in electrical connection with the node location.

44. The integrated circuitry of claim 13 wherein the device components comprise field effect transistor gates.

* * * * *

UNITED STATES PATENT AND TRADEMARK OFFICE
CERTIFICATE OF CORRECTION

| | | |
|---|---|---|
| PATENT NO. | : 7,291,895 B2 | Page 1 of 1 |
| APPLICATION NO. | : 10/391952 | |
| DATED | : November 6, 2007 | |
| INVENTOR(S) | : Trapp et al. | |

It is certified that error appears in the above-identified patent and that said Letters Patent is hereby corrected as shown below:

In column 8, line 27, in Claim 32, after "relationship" delete "." and insert -- , --, therefor.

In column 8, line 30, in Claim 32, after "relationship" delete "." and insert -- , --, therefor.

In column 8, line 52, in Claim 36, after "claim 35" insert -- wherein --.

In column 10, line 12, in Claim 44, delete "claim 13" and insert -- claim 43 --, therefor.

Signed and Sealed this

Eighteenth Day of March, 2008

JON W. DUDAS
*Director of the United States Patent and Trademark Office*